(12) United States Patent
Shen

(10) Patent No.: US 12,396,243 B2
(45) Date of Patent: Aug. 19, 2025

(54) SEMICONDUCTOR STRUCTURE AND METHOD FOR PREPARING SEMICONDUCTOR STRUCTURE

(71) Applicant: CHANGXIN MEMORY TECHNOLOGIES, INC., Hefei (CN)

(72) Inventor: Songmei Shen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 370 days.

(21) Appl. No.: 17/947,227

(22) Filed: Sep. 19, 2022

(65) Prior Publication Data
US 2023/0013859 A1   Jan. 19, 2023

Related U.S. Application Data

(63) Continuation of application No. PCT/CN2022/099412, filed on Jun. 17, 2022.

(30) Foreign Application Priority Data

Jun. 7, 2022   (CN) .......................... 202210634400.2

(51) Int. Cl.
| | |
|---|---|
| *H10D 64/00* | (2025.01) |
| *H10D 64/01* | (2025.01) |
| *H10D 64/66* | (2025.01) |
| H10B 12/00 | (2023.01) |

(52) U.S. Cl.
CPC ........... *H10D 64/679* (2025.01); *H10D 64/01* (2025.01); *H10B 12/00* (2023.02)

(58) Field of Classification Search
CPC .. H10D 64/015; H10D 64/021; H10D 64/679; H01L 21/76888; H01L 21/7682; H01L 21/76834; H01L 21/76885
See application file for complete search history.

(56) References Cited

U.S. PATENT DOCUMENTS

| | | |
|---|---|---|
| 2003/0036260 A1 | 2/2003 | Nakamura |
| 2007/0096202 A1 | 5/2007 | Kang |
| | (Continued) | |

FOREIGN PATENT DOCUMENTS

| | | |
|---|---|---|
| CN | 109935547 A | 6/2019 |
| CN | 112864086 A | 5/2021 |
| | (Continued) | |

OTHER PUBLICATIONS

Japanese Patent Office, Office Action Issued in Application No. 2022-566296, Jul. 30, 2024, 10 pages.

(Continued)

*Primary Examiner* — Reema Patel
(74) *Attorney, Agent, or Firm* — Kilpatrick Townsend & Stockton LLP

(57) ABSTRACT

A semiconductor structure and a method for preparing a semiconductor structure are provided. The method for preparing the semiconductor structure includes operations as follows. A substrate is provided, and a plurality of gate structures are arranged at intervals on the substrate. A sacrificial sidewall with a preset thickness is formed on a sidewall of the gate structure. A first dielectric layer is formed between adjacent sacrificial sidewalls, a top of the first dielectric layer being flush with a top of the gate structure and a top of the sacrificial sidewalls. The sacrificial sidewall is removed and an air gap structure is formed on the sidewall of the gate structure. A second dielectric layer is formed, the second dielectric layer covering the top of the gate structure, a top opening of the air gap structure and the top of the first dielectric layer.

12 Claims, 13 Drawing Sheets

(56) References Cited

U.S. PATENT DOCUMENTS

| | | |
|---|---|---|
| 2010/0295113 A1 | 11/2010 | Kang |
| 2011/0278654 A1 | 11/2011 | Ueda |
| 2012/0104512 A1 | 5/2012 | Horak |
| 2013/0178044 A1 | 7/2013 | Kang et al. |
| 2013/0299920 A1 | 11/2013 | Yin et al. |
| 2018/0166553 A1 | 6/2018 | Lee et al. |
| 2021/0090959 A1 | 3/2021 | Min et al. |
| 2021/0193798 A1 | 6/2021 | Liang et al. |
| 2021/0249519 A1 | 8/2021 | Yao et al. |
| 2021/0391261 A1 | 12/2021 | Liao et al. |
| 2022/0085185 A1 | 3/2022 | Yao et al. |
| 2022/0102192 A1 | 3/2022 | Su et al. |

FOREIGN PATENT DOCUMENTS

| | | |
|---|---|---|
| CN | 113113492 A | 7/2021 |
| CN | 114566467 A | 5/2022 |
| JP | S6014474 A | 1/1985 |
| JP | 2001044427 A | 2/2001 |
| JP | 2004119549 A | 4/2004 |
| JP | 2013145800 A | 7/2013 |
| KR | 100672823 B1 | 1/2007 |
| KR | 20130125561 A | 11/2013 |
| KR | 20140104890 A | 8/2014 |
| KR | 20170057102 A | 5/2017 |
| WO | 2006045722 A1 | 5/2006 |
| WO | 2013166632 A1 | 11/2013 |

OTHER PUBLICATIONS

Korean Intellectual Property Office, Office Action Issued in Application No. 10-2023-7000717, May 22, 2024, 15 pages.
First Office Action of the Taiwanese application No. 111141807, issued on May 10, 2023. 7 pages with English 1 abstract.
Supplementary European Search Report in the European application No. 22790432.3, mailed on Nov. 23, 2023. 9 pages.

SEMICONDUCTOR STRUCTURE AND METHOD FOR PREPARING SEMICONDUCTOR STRUCTURE

CROSS-REFERENCE TO RELATED APPLICATIONS

This is a continuation of International Patent Application No. PCT/CN2022/099412, filed on Jun. 17, 2022, which claims priority to Chinese Patent Application No. 202210634400.2, filed on Jun. 7, 2022 and entitled "SEMICONDUCTOR STRUCTURE AND METHOD FOR PREPARING SAME". The disclosures of International Patent Application No. PCT/CN2022/099412 and Chinese Patent Application No. 202210634400.2 are hereby incorporated by reference in their entireties.

BACKGROUND

With the development of semiconductor technology, the feature size of a device in an integrated circuit is getting smaller. After the semiconductor technology enters a deep sub-micron stage, the size of Dynamic Random Access Memory (DRAM) as a common semiconductor structure in an electronic device such as a computer, is getting smaller. Accordingly, the size of the component devices in the DRAM and the spacing between adjacent devices are getting smaller.

At present, in the process of preparing the DRAM, the Back end of line (BEOL) is used to establish multiple layers of wires, and the wires of different layers are connected by conductive holes. However, wires and conductive holes are mostly made of metal, which results in the parasitic capacitance between adjacent wires. In addition, with the continuous reduction of the feature size of a device, the parasitic capacitance between the aforementioned wires increases continuously, this results in apparent RC-Delay effect in the DRAM, and easily reduces the service life of the device in the DRAM.

SUMMARY

The present disclosure relates to the technical field of manufacturing a semiconductor integrated circuit, and in particular to a semiconductor structure and a method for preparing the semiconductor structure.

A first aspect of the embodiments of the disclosure provides a method for preparing a semiconductor structure, which includes operations as follows. A substrate is provided, and a plurality of gate structures are arranged at intervals on the substrate. A sacrificial sidewall with a preset thickness is formed on a sidewall of the gate structure. A first dielectric layer is formed between adjacent sacrificial sidewalls. A top of the first dielectric layer is flush with a top of the gate structure and a top of the sacrificial sidewall. The sacrificial sidewall is removed and an air gap structure is formed on the sidewall of the gate structure. A second dielectric layer is formed. The second dielectric layer covers the top of the gate structure, a top opening of the air gap structure and the top of the first dielectric layer.

A second aspect of the disclosure provides a semiconductor structure formed by the method for preparing the semiconductor structure as described in some embodiments above. The semiconductor structure includes: a substrate; a plurality of gate structures arranged on the substrate at intervals; an air gap structure arranged at a sidewall of the gate structure; a first dielectric layer arranged between the air gap structures on the sidewalls of adjacent gate structures; and a second dielectric layer covering a top of the gate structure, a top opening of the air gap structure and a top of the first dielectric layer.

Details of one or more embodiments of the present disclosure are set forth in the following drawings and descriptions. Other features, purposes and advantages of the present disclosure will become apparent from the specification, drawings, and claims.

BRIEF DESCRIPTION OF THE DRAWINGS

In order to more clearly explain the technical solutions in the embodiments of the disclosure or in a conventional technology, the drawings required in the descriptions of the embodiments or the conventional technology are briefly introduced below. It is apparent that the drawings in the following descriptions only show some embodiments of the disclosure. Those of ordinary skill in the art may also obtain other drawings in accordance with these drawings without paying creative labor.

FIG. 12 is also a schematic structural diagram of a semiconductor structure according to an embodiment.

DETAILED DESCRIPTION

Figure 1:
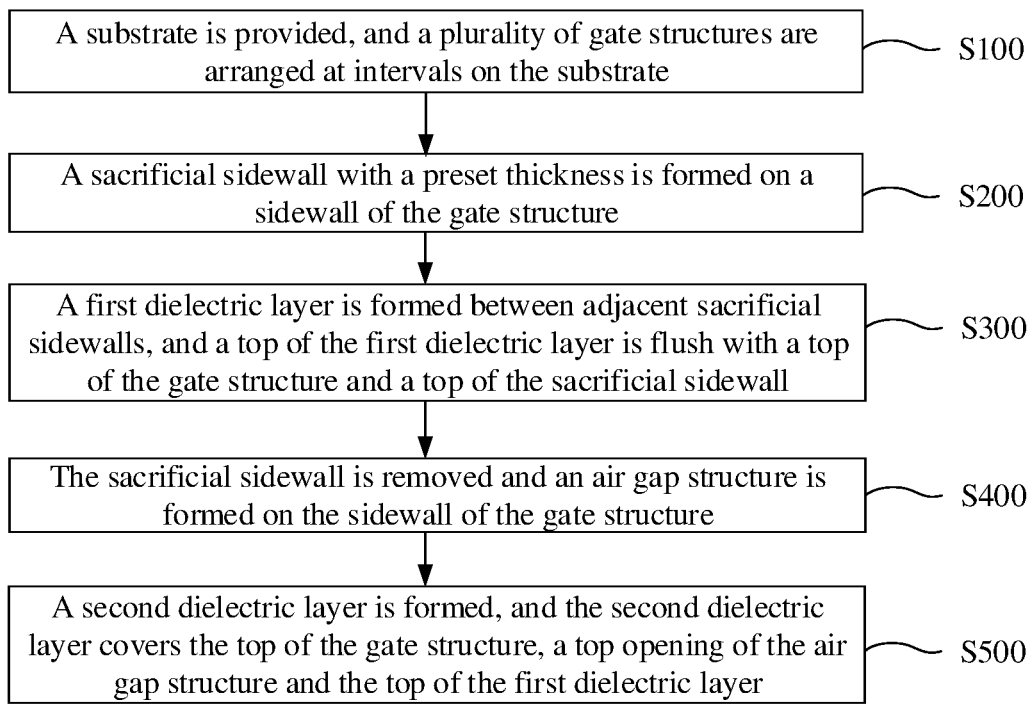
FIG. 1 is a flowchart of a method for preparing a semiconductor structure according to an embodiment.

In order to facilitate the understanding of the disclosure, the disclosure will be described more comprehensively below with reference to the drawings. The embodiments of the disclosure are given in the drawings. However, the disclosure may be implemented in many different forms and is not limited to the embodiments described herein. On the contrary, these embodiments are provided for the purpose of making the disclosure more thorough and comprehensive.

Unless otherwise defined, all technological and scientific terms used in the disclosure have meanings the same as those usually understood by those skilled in the art of the disclosure. Terms used in the description of the present disclosure are only adopted to describe the purpose of the specific embodiments and not intended to limit the disclosure.

It is to be understood that description that an element or layer is "above", "adjacent to", "connected to", or "coupled to" another element or layer may refer to that the element or layer is directly above, adjacent to, connected to or coupled to the other element or layer, or there may be an intermediate element or layer between the elements or layers. On the contrary, description that an element is "directly on", "directly adjacent to", "directly connected to" or "directly coupled to" another element or layer refers to that there is no intermediate element or layer between the elements and layers.

Spatially relational terms such as "below", "under", "lower", "beneath", "above", and "upper" may be used herein to describe a relationship between one element or feature and another element or feature illustrated in the drawings. It is to be understood that, in addition to the orientation shown in the drawings, the spatially relational terms are intended to further include different orientations of devices in use and operation. For example, if the devices in the drawings are turned over, elements or features described as being "under" or "beneath" or "below" other elements or features will be oriented to be "on" the other elements or features. Therefore, the exemplary terms "under" and "below" may include two orientations "on" and "below". In addition, the device may be otherwise oriented (for example, rotated by 90 degrees or in other orientations) and the spatial descriptors used herein may be interpreted accordingly.

As used herein, singular forms "a/an", "one", and "the" may also include the plural forms, unless otherwise specified in the context. It is also to be understood that terms "including/containing" and/or "having" specify the presence of the described features, integers, steps, operations, components, parts or combinations thereof, but the presence or addition of one or more other features, integers, steps, operations, components, parts or combinations thereof is also possible. Also, term "and/or" herein includes any and all combinations of the related listed items.

As used herein, the "deposition" process includes, but is not limited to, Physical Vapor Deposition (PVD), Chemical Vapor Deposition (CVD) or Atomic Layer Deposition (ALD).

In addition, the embodiments of the disclosure are described here with reference to schematic diagrams of ideal embodiments (and an intermediate structure) of the present disclosure, so that changes in a shape as shown due to, for example, manufacturing technology and/or a tolerance may be expected. Therefore, the embodiments of the present disclosure shall not be limited to the specific shapes of a region shown here, but include shape deviations caused by, for example, the manufacturing technology. The regions shown in the drawings are schematic in nature, and the shapes thereof do not represent the actual shapes of the regions of the device, and do not limit the scope of the disclosure.

With the development of semiconductor technology, the feature size of a device in an integrated circuit is getting smaller. After the semiconductor technology enters a deep sub-micron stage, the size of Dynamic Random Access Memory (DRAM) is getting smaller. Accordingly, the size of the component devices in the DRAM and the spacing between adjacent devices are getting smaller.

At present, in the process of preparing the DRAM, the Back end of line (BEOL) is used to establish multiple layers of wires, and the wires of different layers are connected by conductive holes. However, wires and conductive holes are mostly made of metal, which results in the parasitic capacitance between adjacent wires. In addition, with the continuous reduction of the feature size of a device, the parasitic capacitance between the aforementioned wires increases continuously, this results in apparent RC-Delay effect in the DRAM, and easily reduces the service life of the device in the DRAM.

Based thereon, the embodiments of the disclosure provide a semiconductor structure and a method for preparing a semiconductor structure, which facilitates reduction of the parasitic capacitance and implements balance control for the parasitic capacitance corresponding to different devices, so as to effectively improve the device performance of the semiconductor structure, thereby reducing the RC-Delay of the semiconductor structure, and prolonging the service life of the semiconductor structure.

Referring to FIG. 1, the embodiment of the disclosure provides a method for preparing a semiconductor structure. The method includes the following operations.

At S100, a substrate is provided, and a plurality of gate structures are arranged at intervals on the substrate.

At S200, a sacrificial sidewall with a preset thickness is formed on a sidewall of the gate structure.

At S300, a first dielectric layer is formed between adjacent sacrificial sidewalls. The top of the first dielectric layer is flush with the top of the gate structure and the top of the sacrificial sidewalls.

At S400, the sacrificial sidewall is removed and an air gap structure is formed on the sidewall of the gate structure.

At S500, a second dielectric layer is formed. The second dielectric layer covers the top of the gate structure, a top opening of the air gap structure and the top of the first dielectric layer.

In the embodiments of the present disclosure, the sacrificial sidewall with a preset thickness is formed on the sidewall of the gate structure without using a mask, and an air gap structure with a preset size may be formed after the sacrificial sidewall is removed, thus effectively isolating the gate structure by the air gap structure, and effectively reducing the parasitic capacitance of the device where the gate structure is arranged. The method provided by the embodiments of the disclosure has a simple process, and also facilitates implementation and production cost reduction. Furthermore, in the embodiments of the disclosure, the balance control for the parasitic capacitance corresponding to different devices can also be implemented by controlling the size of the air gap structure (such as the height and width of the air gap structure) in different devices, so as to effectively improve the device performance of the semiconductor structure. Accordingly, the RC-Delay of the semiconductor structure may be reduced.

In addition, a static current (that is, IDD current, which refers to a leakage current when the device is static) of a transistor device in the semiconductor structure is directly proportional to the parasitic capacitance. In the embodiments of the disclosure, the air gap structure is arranged on the sidewall of the gate structure, which can reduce the parasitic capacitance and the leakage current of the device, and thus reduce the power consumption of the transistor device in the turned off state, thereby effectively prolonging the service life of the transistor device and the semiconductor structure.

Figure 2:
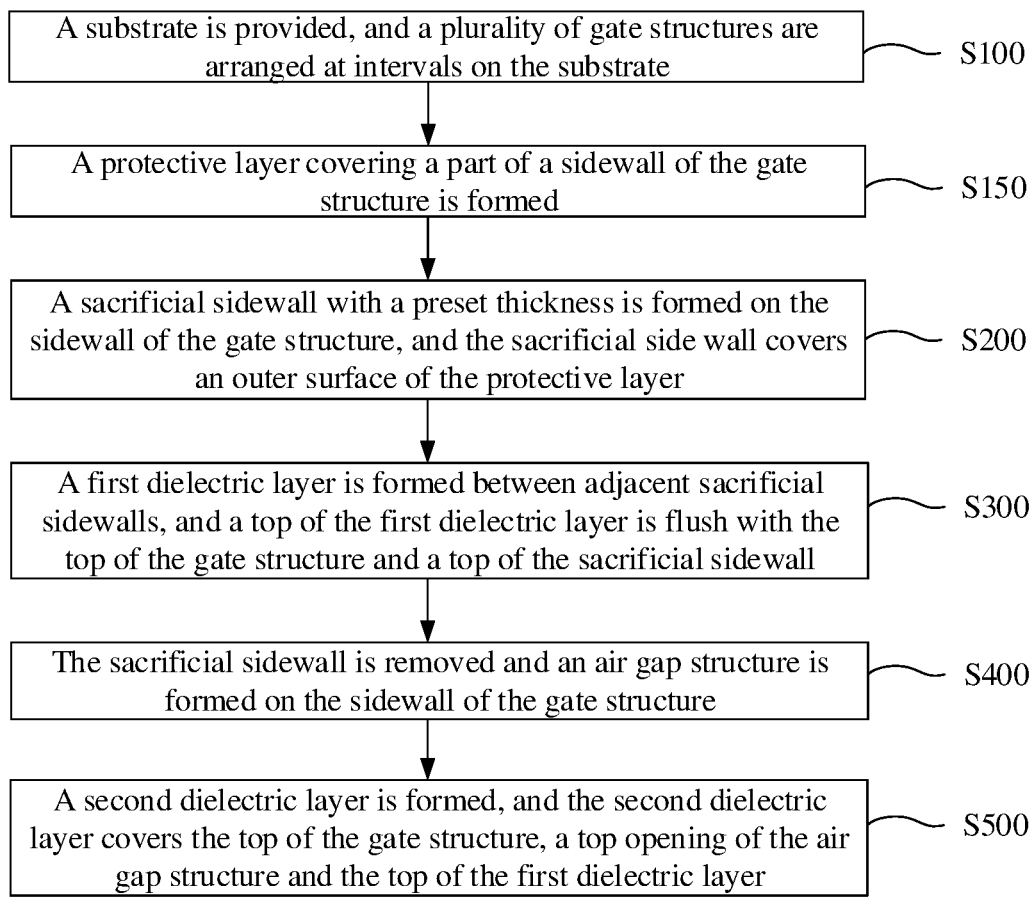
FIG. 2 is a flowchart of another method for preparing a semiconductor structure according to an embodiment of the disclosure.

Referring to FIG. 2, in some embodiments of the disclosure, before the operation S200 that a sacrificial sidewall with a preset thickness is formed on the sidewall of the gate structure, the method for preparing the semiconductor structure further includes an operation S150 that a protective layer covering a part of the sidewall of the gate structure is formed. The sacrificial sidewall covers the outer surface of the protective layer.

It is to be noted that the gate structure, as a control element of the device, has a conductive function. In some embodiments of the disclosure, the gate structure includes a metal layer. The operation S100 that a plurality of gate structures are arranged at intervals on the substrate includes operations as follows. A plurality of initial gate structures are arranged at intervals on the substrate, and the initial gate structure includes an initial metal layer. A part of the sidewall of the initial metal layer is oxidized to form the protective layer. The initial metal layer which is not oxidized forms the metal layer. Thus, the protective layer may be directly formed based on the initial metal layer, which facilitates simplifying the process and ensures that execution of the subsequent process has no adverse effects on the metal layer of the gate structure, thus ensuring the electrical performance of the gate structure.

Combining the material of the initial metal layer, in some embodiments of the disclosure, the operation that a part of the sidewall of the initial metal layer is oxidized includes an operation that a liquid ozone solution is employed for processing. Thus, a dense metal oxide may be formed on the surface of the initial metal layer as a protective layer.

In addition, in some embodiments of the disclosure, the gate structure also includes a first barrier layer, and the first barrier layer covers the top of the metal layer and the top of the protective layer. In some embodiments of the disclosure, the gate structure also includes a second barrier layer, and the second barrier layer is arranged between the substrate and the metal layer as well as between the substrate and the protective layer. From the above description, the gate structure may be implemented in many different ways, such as employing a single-layer structure or a multi-layer structure, which may be set according to actual requirements.

It is to be noted that, in some embodiments of the disclosure, the operation S200 that a sacrificial sidewall with a preset thickness is formed on the sidewall of the gate structure includes operations as follows. An initial sacrificial layer with uniform thickness is formed on the surface of the gate structure and the substrate. The initial sacrificial layer arranged on the top of the gate structure and the surface of the substrate is removed to retain the initial sacrificial layer on the sidewall of the gate structure to form the sacrificial sidewall.

Here, the initial sacrificial layer is formed by a deposition process, and the thickness of the initial sacrificial layer may be selected and set as required. The uniform thickness of the initial sacrificial layer may ensure that the sacrificial sidewalls formed on the sidewalls of different gate structures have identical thickness, and then the air gap structure with the same width in a direction parallel to the substrate may be formed, to accurately control the parasitic capacitance corresponding to different devices to keep balance.

In some embodiments of the disclosure, after the operation S200 that the sacrificial sidewall with a preset thickness is formed on the sidewall of the gate structure, the method further includes operations as follows. An initial first dielectric layer is formed between adjacent sacrificial sidewalls and above the gate structure, and a part of the initial first dielectric layer is removed by planarization process to form the first dielectric layer. The top of the first dielectric layer is flush with the top of the first barrier layer. Thus, the first barrier layer may be directly used as a polishing barrier layer for the planarization on the initial first dielectric layer. That is, in the process of removing a part of the initial first dielectric layer by planarization process, the first dielectric layer arranged between adjacent sacrificial sidewalls can be directly formed without arranging a mask, and it is ensured that the top of the first dielectric layer is flush with the top of the first barrier layer, thereby facilitating the simplification of the preparation process.

In order to more clearly explain the method for preparing the semiconductor structure in the some embodiments above, referring to FIGS. 3-12 for understanding, the method is described in detail in some embodiments below by taking the example that the gate structure includes the first barrier layer, the metal layer and the second barrier layer which are stacked.

Figure 3:
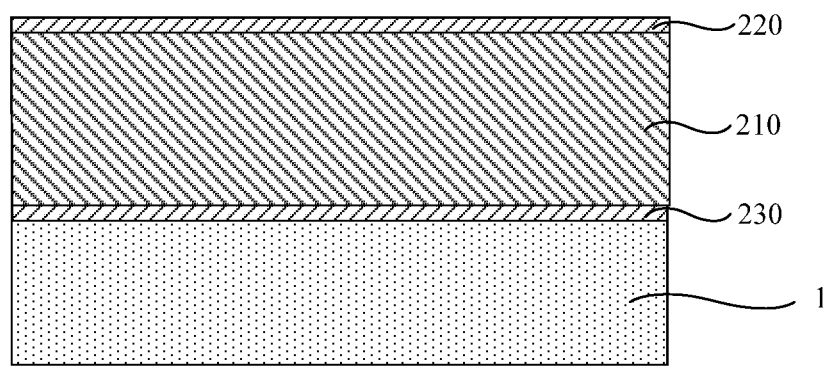
FIGS. 3-5 are cross-sectional diagrams of an intermediate structure and a resulting structure corresponding to an operation S100 according to an embodiment.
Figure 4:
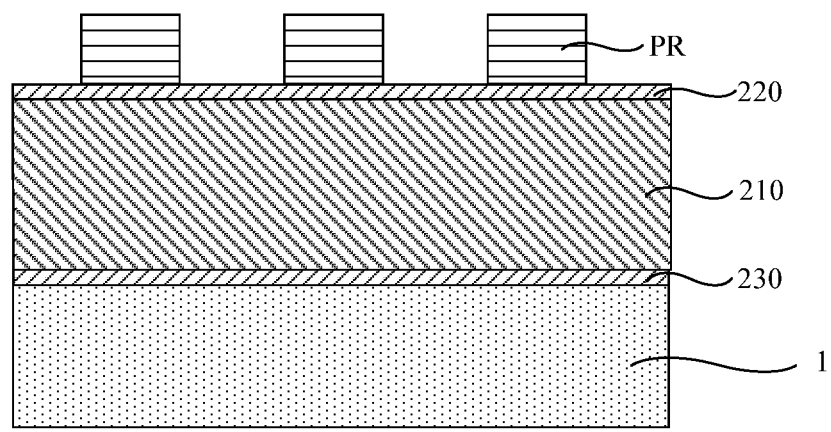
Figure 5:
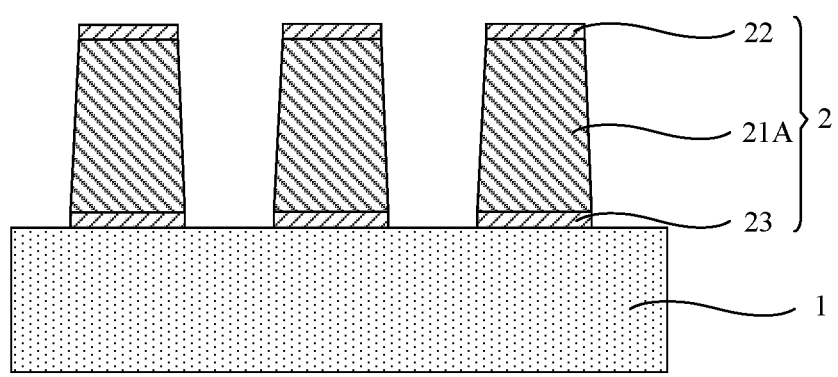

In S100, referring to FIGS. 3-5, a substrate 1 is provided, and a plurality of gate structures 2 are arranged at intervals on the substrate 1.

In some embodiments, the substrate 1 may be made of a semiconductor material, an insulating material, a conductor material or any combination thereof. The substrate 1 may be a single-layer structure and may also be a multi-layer structure. For example, the substrate 1 may be a Silicon (Si) substrate, a Silicon Germanium (SiGe) substrate, a Silicon Germanium Carbon (SiGeC) substrate, a Silicon Carbide (SiC) substrate, a Gallium Arsenide (GaAs) substrate, an Indium Arsenide (InAs) substrate, an Indium Phosphide (InP) substrate or other III/V semiconductor substrates or II/VI semiconductor substrates. Alternatively, for another example, the substrate 1 may be a layered substrate including Si/SiGe, Si/SiC, Si-on-Insulator (SOI) or SiGe-on-insulator.

Exemplarily, a trench isolation structure (not shown in FIGS. 3-5) is arranged in the substrate 1, and the substrate 1 may be divided into a plurality of active areas by the trench isolation structure, for facilitating forming the transistor in the corresponding active area. That is, the gate structure 2, as a component of the transistor, may be arranged in the corresponding active area. In addition, other components of the transistor may be implemented with reference to the implementation modes in a conventional technology, which is not limited in the embodiments of the present disclosure.

In some embodiments, the gate structure 2 includes a first barrier layer 22, a metal layer 21 and a second barrier layer 23 which are stacked. Correspondingly, the operation of arranging a plurality of gate structures 2 at intervals on the substrate includes the following operations.

As shown in FIG. 3, according to the gate structure 2 to be formed, a second barrier material layer 230, a metal material layer 210 and a first barrier material layer 220 are sequentially stacked on the substrate 1. Herein, the material of the second barrier material layer 230 may be the same as or different from the material of the first barrier material layer 220. Exemplarily, the materials of the second barrier material layer 230 and the first barrier material layer 220 are one of Tantalum (Ta), Tantalum Nitride (TaN), Copper (Cu) or Titanium Nitride (TiN), respectively. The material of the metal material layer 210 is for example Aluminum (Al). The second barrier material layer 230 is arranged between the metal material layer 210 and the substrate 1, which may prevent the metal material layer 210 from being oxidized by contacting with the oxide on the substrate 1. The first barrier material layer 220 is arranged on the top of the metal material layer 210, which may protect the metal material layer 210 from being etched and damaged, so as to ensure good electrical performance of the metal material layer 210.

As shown in FIG. 4, a photoresist PR is coated on the top of the first barrier material layer 220, and a mask pattern is formed in the photoresist PR. The mask pattern is configured to define a formation position of the gate structure 2.

As shown in FIG. 5, the first barrier material layer 220, the metal material layer 210 and the second barrier material layer 230 are etched based on the mask pattern in the photoresist PR, and the first barrier layer 22, the initial metal layer 21A and the second barrier layer 23 may be respectively formed, so that the first barrier layer 22, the initial metal layer 21A and the second barrier layer 23 constitute an initial gate structure.

Here, it is to be understood that the metal material layer 210 may be etched to direct form the metal layer 21. Thus, the first barrier layer 22, the metal layer 21A and the second barrier layer 23 may constitute the gate structure 2. That is, the preparation of the gate structure 2 is directly completed.

In the embodiment, the metal material layer 210 is etched to form the initial metal layer 21A, which facilitates directly forming a protective layer 3 using the surface of the initial metal layer 21A subsequently.

Figure 6:
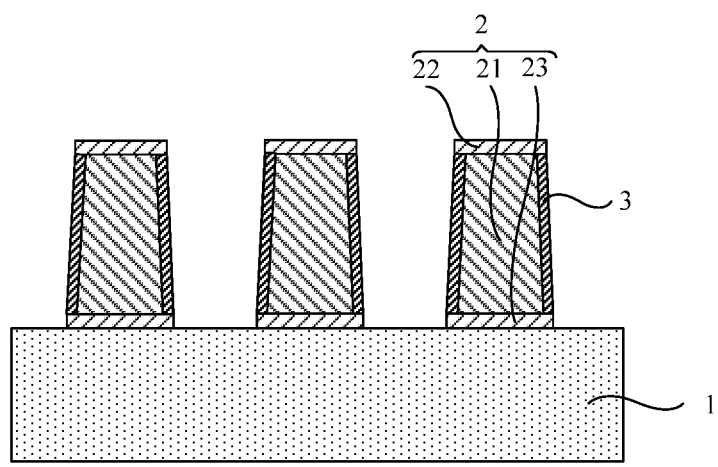
FIG. 6 is a cross-sectional diagram of a resulting structure corresponding to an operation S150 according to an embodiment.

In S150, referring to FIG. 6, a protective layer 3 covering a part of the sidewall of the gate structure 2 is formed.

Here, the protective layer 3 may be formed on the sidewall of the gate structure 2 by a deposition process, and may also be formed by other modes.

Exemplarily, after a plurality of initial gate structures are arranged at intervals on the substrate 1, a part of a sidewall of the initial metal layer 21A is oxidized to form the protective layer 3. Thus, the initial metal layer 21A which is not oxidized forms the metal layer 21. Thus, the protective layer 3 may be directly formed based on the initial metal layer 21A, which facilitates simplifying the process and ensuring that execution of the subsequent process has no adverse effects on the metal layer 21 of the gate structure 2, thus ensuring the electrical performance of the gate structure 2.

Exemplarily, the operation of oxidizing a part of the sidewall of the initial metal layer 21A includes employing a liquid ozone solution for processing. Thus, a dense metal oxide may be formed on the surface of the initial metal layer 2A as a protective layer 3.

Here, the operation of employing a liquid ozone solution for processing may include operations as follows. The liquid ozone solution is employed for cleaning a wafer after the initial gate structure is formed, so that not only microparticles on the wafer surface can be removed, but also the sidewall of the initial metal layer 21A exposed to the air may be oxidized to form a dense oxide. For example, an aluminum oxide film is formed on the surface of the aluminum metal layer as the protective layer 3.

In addition, the liquid ozone solution may be used together with a room-temperature acidic solution or frozen deionized water to effectively clean the wafer after the initial gate structure is formed without adding a corrosive chemical. Thus, the production cost may be reduced by reducing the use of a chemical. In addition, a working space required for processing using the liquid ozone solution is small, and compared with bench operation of using a chemical for wet etching, the processing using the liquid ozone solution has faster working efficiency to improve the production efficiency.

Exemplarily, the thickness of the protective layer 3 is not greater than 1 nm. But it is not limited thereto.

Figure 7:
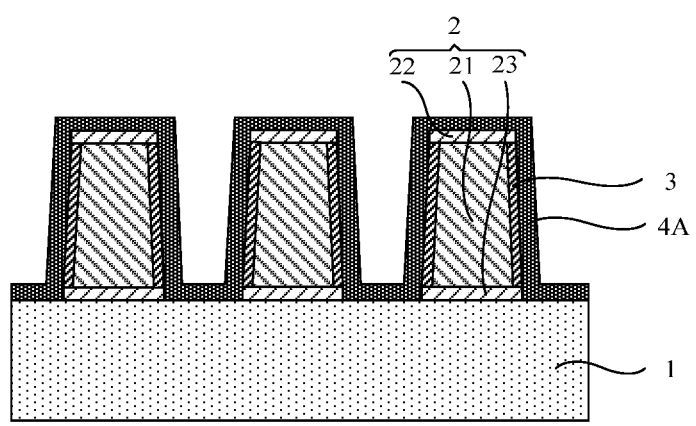
FIGS. 7-8 are cross-sectional diagrams of an intermediate structure and a resulting structure corresponding to an operation S200 according to an embodiment.
Figure 8:
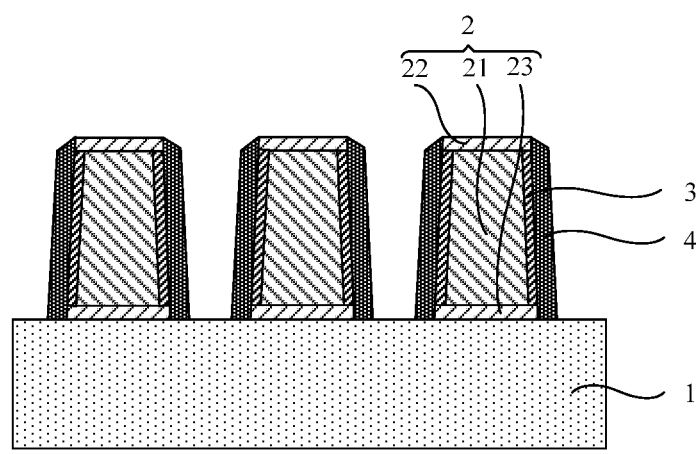

In S200, referring to FIGS. 7 and 8, a sacrificial sidewall 4 with a preset thickness is formed on the sidewall of the gate structure 2.

In the example where the semiconductor structure includes the protective layer 3, the sacrificial sidewall 4 covers an outer surface of the protective layer 3.

Here, the sacrificial sidewall 4 may be made of a nitride material, such as silicon nitride. The thickness of the sacrificial sidewall 4 may be determined according to spacing between adjacent gate structures 2 and a size design of the air gap structure G to be formed.

Exemplarily, the operation S200 includes the following operations.

As shown in FIG. 7, an initial sacrificial layer 4A with uniform thickness is formed on a surface of the gate structure 2 and the surface of the substrate 1.

Here, the initial sacrificial layer 4A is formed by a deposition process, and the thickness thereof may be selected and set as required. In the example where the semiconductor structure also includes the protective layer 3, the initial sacrificial layer 4A covers, for example, outer surfaces of the first barrier layer 22, the protective layer 3 and the second barrier layer 23.

As shown in FIG. 8, the initial sacrificial layer 4A on the top of the gate structure 2 and the surface of the substrate 1 is removed, to retain the initial sacrificial layer 4A on the sidewall of the gate structure 2 to form the sacrificial sidewall 4.

Here, the initial sacrificial layer 4A on the top of the gate structure 2 and the surface of the substrate 1 may be removed by dry etching. Thus, the uniform thickness of the initial sacrificial layer 4A may ensure that the sacrificial sidewalls 4 formed on the sidewalls of different gate structures 2 have the same thickness, and then the air gap structure G with the same width in a direction parallel to the substrate 1 may be formed, to accurately control the parasitic capacitance corresponding to different devices to keep balance.

In addition, it is to be understood that after performing dry etching on the initial sacrificial layer 4A, an inclined face is easily formed on the top of the sacrificial sidewall 4 due to material loss caused by etching. That is, there is an included angle between the top of the sacrificial sidewall 4 and the sidewall of the first barrier layer 22, and the included angle is an acute angle.

Figure 9:
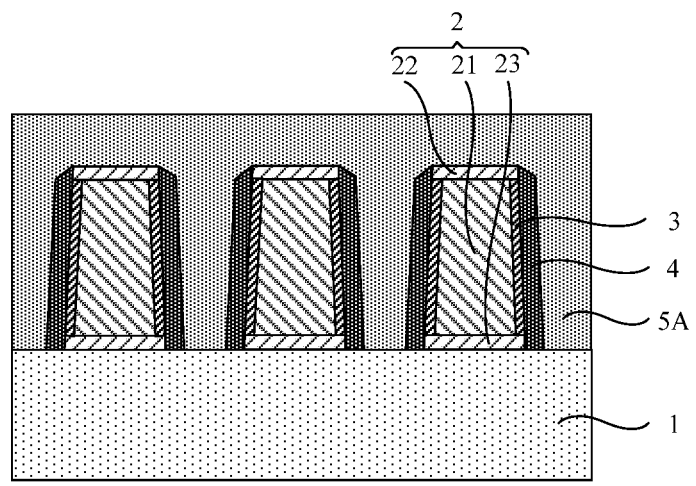
FIGS. 9-10 are cross-sectional diagrams of an intermediate structure and a resulting structure corresponding to an operation S300 according to an embodiment.
Figure 10:
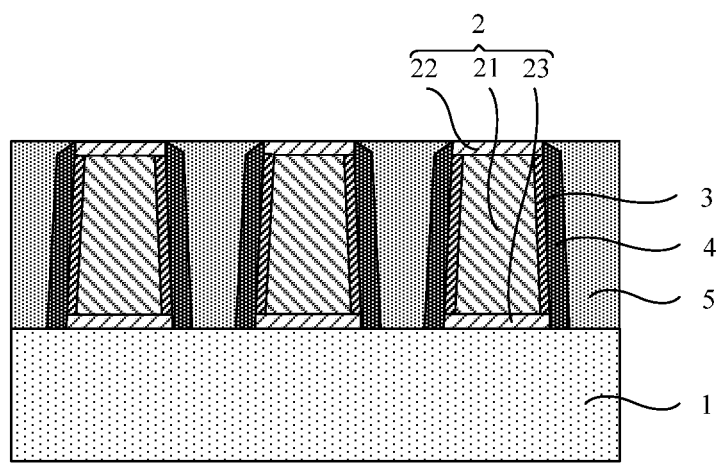

In operation S300, referring to FIGS. 9 and 10, a first dielectric layer 5 is formed between adjacent sacrificial sidewalls 4. The top of the first dielectric layer 5 is flush with the top of the gate structure 2 and the tops of the sacrificial sidewalls 4.

Exemplarily, the operation S300 may include the following operations.

As shown in FIG. 9, an initial first dielectric layer 5A is formed between adjacent sacrificial sidewalls 4 and on the gate structure 2. A material of the initial first dielectric layer 5A is different from the material of the sacrificial sidewall 4, and the initial first dielectric layer 5A may be formed by oxide deposition, such as silicon oxide. The initial first dielectric layer 5A fills the space between adjacent sacrificial sidewalls 4 and covers the top of the sacrificial sidewalls 4 and the top the gate structures 2.

As shown in FIG. 10, a part of the initial first dielectric layer 5A is removed by planarization process to form the first dielectric layer 5.

Here, the planarization process is, for example, Chemical Mechanical Polishing (CMP). The first barrier layer 22 may be directly used as a polishing barrier layer for the planarization on the initial first dielectric layer 5A. That is, in the process of removing a part of the initial first dielectric layer 5A by planarization process, the first dielectric layer arranged between adjacent sacrificial sidewalls 4 can be directly formed without arranging a mask, and it is ensured that the top of the first dielectric layer 5 is flush with the top of the first barrier layer 22, thus facilitating the simplification of the preparation process.

Figure 11:
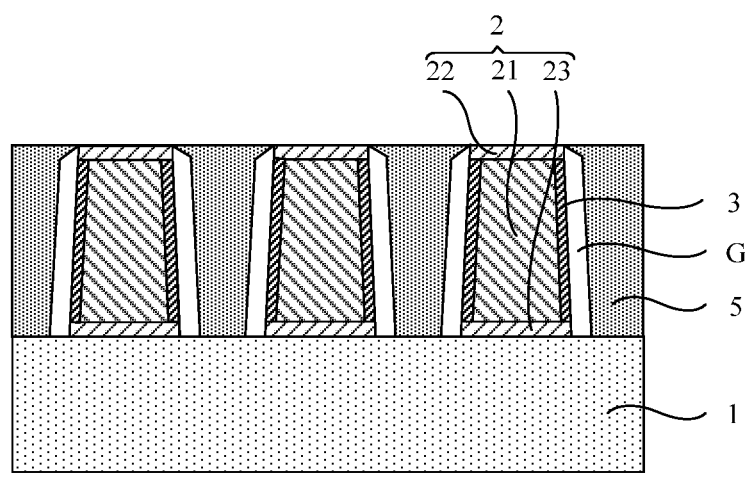
FIG. 11 is a cross-sectional diagram of a resulting structure corresponding to an operation S400 according to an embodiment.

In operation S400, referring to FIG. 11, the sacrificial sidewall 4 is removed and an air gap structure G is formed on the sidewall of the gate structure 2.

In some embodiments of the disclosure, the sacrificial sidewall 4 is made of a silicon nitride material. The sacrificial sidewall 4 may be removed by a low-temperature phosphoric acid solution. Herein, a temperature of the low-temperature phosphoric acid solution is less than or equal to 120° C. Compared with a high-temperature phosphoric acid solution (for example, the temperature is greater than 150° C.), the low-temperature phosphoric acid solution has a higher etching selectivity ratio for a nitride and an oxide.

Anhydrous pure phosphoric acid is colorless crystal, hygroscopic, soluble in water and miscible with water at any ratio. The low-temperature phosphoric acid solution in the embodiment of the disclosure is a colorless viscous liquid, in which the concentration of phosphoric acid for example accounts for 85%-98%. A reaction mechanism of removing the sacrificial sidewall 4 using the low-temperature phosphoric acid solution may be shown as follows: $Si_3N_4 + 4H_3PO_4 + 12H_2O \rightarrow 3Si(OH)_4 + 4NH_4H_2PO_4$.

According to the foregoing embodiments, it is to be learned that there is an included angle between the top of the sacrificial sidewall 4 and the sidewall of the first barrier layer 22, and the included angle is an acute angle. Thus, after the sacrificial sidewall 4 is removed to form the air gap structure G, the top of the air gap structure G is prone to being closed in and has a small top opening.

Figure 12:
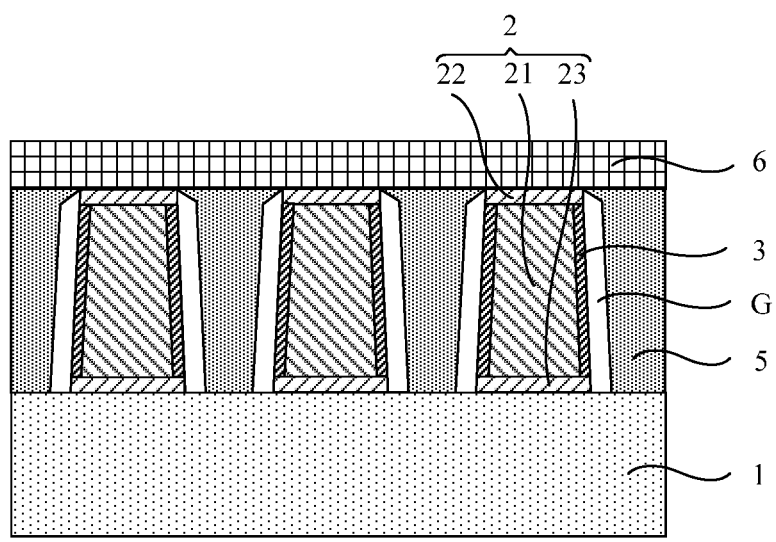
FIG. 12 is a cross-sectional diagram of a resulting structure corresponding to an operation S500 according to an embodiment.

In operation S500, referring to FIG. 12, a second dielectric layer 6 is formed, and the second dielectric layer 6 covers the top of the gate structure 2, the top opening of the air gap structure G and the top of the first dielectric layer 5.

Here, the second dielectric layer 6 may be formed by oxide deposition, such as silicon oxide. The top of the air gap structure G is closed in and has a small top opening, so that in a process of depositing the second dielectric layer 6, the second dielectric layer 6 can easily block the top opening of the air gap structure G and simultaneously cover the tops of the gate structure 2 and the first dielectric layer 5.

Figure 13:
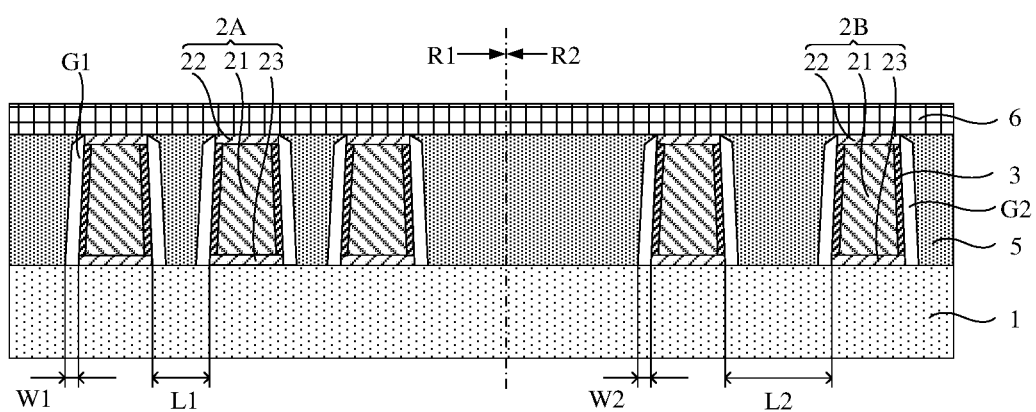
FIG. 13 is a schematic structural diagram of another semiconductor structure according to an embodiment.

It is to be mentioned that, referring to FIG. 13, in some embodiments of the disclosure, the plurality of gate structures 2 include a plurality of first gate structures 2A and a plurality of second gate structures 2B. Herein, there is a first spacing L1 between adjacent first gate structures 2A and a second spacing L2 between adjacent second gate structures 2B, and the first spacing L1 is smaller than the second spacing L2.

Here, it is to be understood that the semiconductor structure generally includes a cell array region R1 and a peripheral circuit region R2 located on at least one side of the cell array region RE Here, the cell array region R1 refers to a region of the semiconductor structure for forming a cell array, such as a region for forming a memory cell array. In DRAM, any memory cell in the memory cell array includes a transistor and a storage capacitor. The peripheral circuit region R2 is located on at least one side of the cell array region R1, such as a side or a peripheral side. The peripheral circuit region R2 refers to a region of the semiconductor structure for forming peripheral circuits. In the DRAM, the peripheral circuit may be connected by multiple transistors and other electronic components (such as capacitors, resistors, etc.) according to the design requirements to achieve a specific function.

For convenience of description, the transistor arranged in the cell array region R1 may be defined as a cell transistor, and the transistor arranged in the peripheral circuit region R2 is defined as a peripheral transistor. Herein, the cell transistor may have a higher turn-on speed than the peripheral transistor. Accordingly, the first gate structure 2A may be a gate structure of the cell transistor, and the second gate structure 2B may be a gate structure of the peripheral transistor. Thus, in the cell array region R1, the spacing between adjacent first gate structures 2A is small, and if only the first dielectric layer (for example, an oxide) is filling in, a large parasitic capacitance may be generated, which reduces the turn-on speed of the cell transistor greatly. Furthermore, in the peripheral circuit region R2, the spacing between adjacent second gate structures 2B is large, and if only the first dielectric layer (for example, an oxide) is filled in, a small parasitic capacitance may be generated, so that the turn-on speed of the peripheral transistor remains unchanged or decreases slightly. Consequently, a reading speed of the cell transistor and the peripheral transistor cannot reach the expectation due to the delay caused by the parasitic capacitance.

Based thereon, the operation of forming a sacrificial sidewall 4 with a preset thickness on the sidewall of the gate structure 2 and forming an air gap structure G on the sidewall of the gate structure 2 includes operations as follows. A first sacrificial sidewall is formed on the sidewall of the first gate structure 2A, and the first sacrificial sidewall is removed to form a first air gap structure G1. A second sacrificial sidewall is formed on the sidewall of the second gate structure 2B, and the second sacrificial sidewall is removed to form a second air gap structure G2.

Here, it is to be understood that the first sacrificial sidewall on the sidewall of the first gate structure 2A and the second sacrificial sidewall on the sidewall of the second gate structure 2B may be formed simultaneously and may also be formed in sequence.

In combination with FIG. 13 for understanding, in some embodiments of the disclosure, the thickness of the first sacrificial sidewall is the same as the thickness of the second sacrificial sidewall. The width of the first air gap structure G1 and the width of the second air gap structure G2 in the direction parallel to the substrate are identical. That is, W1=W2. W1 is the width of the first air gap structure G1 in the direction parallel to the substrate 1, and W2 is the width of the second air gap structure G2 in the direction parallel to the substrate 1. Thus, the first sacrificial sidewall and the second sacrificial sidewall may be formed synchronously, and the first air gap structure G1 and the second air gap structure G2 may be formed synchronously, so as to simplify the preparation process and ensure that the parasitic capacitances corresponding to transistor devices in different regions are kept unchanged.

In combination with FIG. 13 for understanding, in some embodiments of the disclosure, the thickness of the first sacrificial sidewall is smaller than the thickness of the second sacrificial sidewall. The width W1 of the first air gap structure G1 in the direction parallel to the substrate 1 is smaller than the width W2 of the second air gap structure G2 in the direction parallel to the substrate 1. Thus, the first sacrificial sidewall and the second sacrificial sidewall may be formed in sequence. The first air gap structure G1 and the second air gap structure G2 may be formed synchronously or in sequence, so as to control the first air gap structure G1 and the second air gap structure G2 to have different sizes for the transistor devices in different regions, and further control the magnitude of the parasitic capacitance.

It is to be supplemented that the first sacrificial sidewall and the second sacrificial sidewall may be formed by a deposition process. Since the first spacing L1 between adjacent first gate structures 2A is smaller than the second spacing L2 between adjacent second gate structures 2B, the first sacrificial sidewall deposited on the sidewall of the first gate structure 2A is thicker and the second sacrificial sidewall deposited on the sidewall of the second gate structure 2B is thinner in the same deposition process. Based thereon, by controlling deposition rates on the first sacrificial sidewall and the second sacrificial sidewall respectively, the first sacrificial sidewall and the second sacrificial sidewall with the same thickness or preset thickness may be correspondingly formed, and then molding sizes of the first air gap structure G1 and the second air gap structure G2 may be accurately controlled, so that the parasitic capacitances corresponding to the transistor devices in different regions is balanced by the first air gap structure G1 and the second air gap structure G2.

For example, a calculation formula for a capacitance value C of the parasitic capacitance is represented as $C=\epsilon S/d$, where $\epsilon$ is a dielectric constant, S is a relative area between equivalent electrode plates, and d is a distance between the equivalent electrode plates. Thus, in combination with an arrangement position of the gate structure 2, in the case where the gate structure 2 is equivalent to an electrode plate, a distance between the equivalent electrode plates refers to a distance in the direction parallel to the substrate 1. In the embodiment of the disclosure, by controlling the width of the first air gap structure G1 and the width of the second air gap structure G2 in the direction parallel to the substrate 1, the dielectric constant E may be correspondingly controlled, and then a capacitance value of the parasitic capacitance is controlled. Thus, the parasitic capacitance of the transistor device in the cell array region R1 and the parasitic capacitance of the transistor device in the peripheral circuit region R2 may be balanced to make the two parasitic capacitances almost consistent. Therefore, the transistor devices in the cell array region R1 and the peripheral circuit region R2 can be controlled to be turned on at a preset turn-on speed ratio, thereby avoiding the device performance of the semiconductor structure from being affected by the inconsistent parasitic capacitances.

Referring to FIGS. 12 and 13, some embodiments of the disclosure provide a semiconductor structure formed by the method for preparing the semiconductor structure as described in some embodiments above. The semiconductor structure includes: a substrate 1, a gate structure 2, an air gap structure G, a first dielectric layer 5 and a second dielectric layer 6. There are a plurality of gate structures 2, and the plurality of gate structures 2 are arranged on the substrate 1 at intervals. The air gap structure G is arranged on a sidewall of the gate structure 2. The first dielectric layer 5 is arranged between the air gap structures G on the sidewalls of adjacent gate structures 2. The second dielectric layer 6 covers the top of the gate structure 2, a top opening of the air gap structure G and the top of the first dielectric layer 5.

In the embodiment of the present disclosure, the air gap structure G may be formed by forming a sacrificial sidewall with a preset thickness on the sidewall of the gate structure 2 without using a mask, and removing the sacrificial sidewall. Thus, not only the gate structure 2 can be effectively isolated by the air gap structure G, but also the parasitic capacitance of the device where the gate structure 2 is arranged is effectively reduced. The process of preparing the semiconductor structure provided by the embodiment of the disclosure is simple, which facilitates implementation and reduces production cost. Furthermore, in the embodiment of the disclosure, by controlling the formation thickness of the sacrificial sidewall, the size of the air gap structure G in different devices may be controlled to be a preset size. Thus, the balance control of the parasitic capacitance corresponding to different devices can be implemented, so as to effectively improve the device performance of the semiconductor structure. Accordingly, the RC-Delay of the semiconductor structure may be reduced.

In addition, a static current (that is, IDD current, which refers to a leakage current when the device is static) of a transistor device in the semiconductor structure is directly proportional to the parasitic capacitance. In the embodiments of the disclosure, the air gap structure G is arranged on the sidewall of the gate structure 2, which may reduce the parasitic capacitance and the leakage current of the device, so as to reduce the power consumption of the transistor device in a turned off state, thereby effectively prolonging the service life of the transistor device and the semiconductor structure.

In some embodiments, the substrate 1 may be made of a semiconductor material, an insulating material, a conductor material or any combination thereof. The substrate 1 may be a single-layer structure and may also be a multi-layer structure. For example, the substrate 1 may be a Silicon (Si) substrate, a Silicon Germanium (SiGe) substrate, a Silicon Germanium Carbon (SiGeC) substrate, a Silicon Carbide (SiC) substrate, a Gallium Arsenide (GaAs) substrate, an Indium Arsenide (InAs) substrate, an Indium Phosphide (InP) substrate or other III/V semiconductor substrates or II/VI semiconductor substrates. Alternatively, for another example, the substrate 1 may be a layered substrate including Si/SiGe, Si/SiC, Si-on-Insulator (SOI) or SiGe-on-insulator.

Exemplarily, a trench isolation structure (not shown in FIGS. 12-13) is arranged in the substrate 1, and the substrate 1 may be divided into a plurality of active areas by the trench isolation structure, for facilitating forming the transistor in the corresponding active area. That is, the gate structure 2, as a component of the transistor, may be arranged in the corresponding active area. In addition, other components of the transistor may be implemented with reference to the implementation modes in a conventional technology, which is not limited in the embodiments of the present disclosure.

It is to be supplemented that the aforementioned air gap structure G may be not only formed on the sidewall of the gate structure 2, but also may be extended or applied to a sidewall of a wire connected to the gate structure 2, so as to further reduce the parasitic capacitance and implement balance control for the parasitic capacitance corresponding to different transistor devices, thereby effectively improving the device performance of the semiconductor structure.

Continuously referring to FIG. 12, in some embodiments of the disclosure, the semiconductor structure further includes a protective layer 3 covering a part of the sidewall of the gate structure 2. The air gap structure G is arranged between the protective layer 3 and the first dielectric layer 5.

Continuously referring to FIG. 12, in some embodiments of the disclosure, the gate structure 2 includes a metal layer 21 and a first barrier layer 22 arranged on a side of the metal layer 21 deviating away from the substrate 1. Herein, the protective layer 3 covers the sidewall of the metal layer 21, and the first barrier layer 22 covers the top of the metal layer 21 and the top of the protective layer 3.

Exemplarily, the protective layer 3 is a metal oxide layer. For example, the protection layer 3 is formed by oxidation using a metal material which is the same as the metal layer 21.

Exemplarily, the first barrier layer 22 is one of a Ta layer, a TaN layer, a Cu layer or a TiN layer. The first barrier layer 22 is arranged on the tops of the metal layer 21 and the protective layer 3, which may protect the metal layer 21 from being etched and damaged in the process of preparing the semiconductor structure, and ensure good electrical performance of the metal layer 21.

Continuously referring to FIG. 12, in some embodiments of the disclosure, the top of the first dielectric layer 5 is flush with the top of the first barrier layer 22. That is, the first barrier layer 22 may be directly used as a polishing barrier layer in a process of forming the first dielectric layer 5. Thus, the first dielectric layer 5 arranged between adjacent sacrificial sidewalls 4 may also be directly formed without arranging a mask, so as to simplify the preparation process.

Continuously referring to FIG. 12, in some embodiments of the disclosure, the gate structure 2 further includes a second barrier layer 23. The second barrier layer 23 is arranged between the substrate 1 and the metal layer 21 as well as between the substrate 1 and the protective layer 3.

Exemplarily, the second barrier layer 23 is one of a Ta layer, a TaN layer, a Cu layer or a TiN layer. The second barrier layer 23 is arranged between the metal layer 21 and the substrate 1, which may prevent the metal layer 21 from being oxidized due to the contact with the oxide on the substrate 1.

Referring to FIG. 13, in some embodiments of the disclosure, the plurality of gate structures 2 include a plurality of first gate structures 2A and a plurality of second gate structures 2B. Herein, there is a first spacing L1 between adjacent first gate structures 2A and a second spacing L2 between adjacent second gate structures 2B, and the first spacing L1 is smaller than the second spacing L2. Herein, the air gap structure G on the sidewall of the first gate structure 2A is a first air gap structure G1, and the air gap structure G on the sidewall of the second gate structure 2B is a second air gap structure G2.

It is to be understood that a semiconductor structure is generally provided with a cell array region R1 and a peripheral circuit region R2 located on at least one side of the cell array region RE Here, the cell array region R1 refers to a region of the semiconductor structure for forming a cell array, such as a region for forming a memory cell array. In DRAM, any memory cell in the memory cell array includes a transistor and a storage capacitor. The peripheral circuit region R2 is located on at least one side of the cell array region R1, such as a side or a peripheral side. The peripheral circuit region R2 refers to a region of the semiconductor structure for forming peripheral circuits. In the DRAM, the peripheral circuit may be connected by multiple transistors and other electronic components (such as capacitors, resistors, etc.) according to the design requirements to achieve a specific function.

For convenience of description, the transistor arranged in the cell array region R1 may be defined as a cell transistor, and the transistor arranged in the peripheral circuit region R2 is defined as a peripheral transistor. Accordingly, the first gate structure 2A may be a gate structure of the cell transistor, and the second gate structure 2B may be a gate structure of the peripheral transistor.

Continuously referring to FIG. 13, in some examples, the width of the first air gap structure G1 and the width of the second air gap structure G2 in a direction parallel to the substrate 1 are identical. That is, W1=W2. W1 is the width of the first air gap structure G1 in the direction parallel to the substrate 1, and W2 is the width of the second air gap structure G2 in the direction parallel to the substrate 1. Thus, the first air gap structure G1 and the second air gap structure G2 may be formed synchronously, so as to simplify the preparation process and ensure that the parasitic capacitances corresponding to transistor devices in different regions are kept unchanged Continuously referring to FIG. 13, in other examples, the width W1 of the first air gap structure G1 in the direction parallel to the substrate 1 is smaller than the width W2 of the second air gap structure G2 in the direction parallel to the substrate 1. Thus, the first air gap structure G1 and the second air gap structure G2 may be formed synchronously or in sequence, so as to control the first air gap structure G1 and the second air gap structure G2 to have different sizes for the transistor devices in different regions, and further control the magnitude of the parasitic capacitance.

For example, a calculation formula for a capacitance value C of the parasitic capacitance is represented as $C=\epsilon S/d$, where $\epsilon$ is a dielectric constant, S is a relative area between equivalent electrode plates, and d is a distance between the equivalent electrode plates. Thus, in combination with an arrangement position of the gate structure 2, in the case where the gate structure 2 is equivalent to an electrode plate, a distance between the equivalent electrode plates refers to a distance in the direction parallel to the substrate 1. In the embodiment of the disclosure, by controlling the width of the first air gap structure G1 and the width of the second air gap structure G2 in the direction parallel to the substrate 1, the dielectric constant E may be correspondingly controlled, and then a capacitance value of the parasitic capacitance is controlled. Thus, the parasitic capacitance of the transistor device in the cell array region R1 and the parasitic capacitance of the transistor device in the peripheral circuit region R2 may be balanced to make the two parasitic capacitances almost consistent. Therefore, the transistor devices in the cell array region R1 and the peripheral circuit region R2 can be controlled to be turned on at a preset turn-on speed ratio, thereby avoiding the device performance of the semiconductor structure from being affected by the inconsistent parasitic capacitances.

All the technical characteristics of the above embodiments may be combined arbitrarily. In order to make the descriptions concise, not all possible combinations of the technical characteristics in the above embodiments are described. However, as long as there is no contradiction among the combinations of these technical characteristics, they shall be considered as the scope of in the specification.

The above embodiments only describe several implementation manners of the disclosure, and the descriptions thereof are more specific and detailed, but they cannot be understood as limiting the scope of protection of the disclosure. It is to be pointed out that, several modifications and improvements may also be made by those of ordinary skill in the art without departing from the concept of the disclosure, and the modifications and improvements all fall within the scope of protection of the disclosure. Therefore, the scope of protection of the disclosure shall be subject to the appended claims.

The invention claimed is:

1. A method for preparing a semiconductor structure, comprising:
   providing a substrate, and arranging a plurality of metal structures at intervals on the substrate, wherein the plurality of metal structures comprises a metal layer;
   forming a sacrificial sidewall with a preset thickness on a sidewall of each of the plurality of metal structures;
   forming a first dielectric layer between adjacent sacrificial sidewalls, wherein a top of the first dielectric layer is flush with a top of each of the plurality of metal structures and a top of the sacrificial sidewall;

removing the sacrificial sidewall and forming an air gap structure on the sidewall of each of the plurality of metal structures; and forming a second dielectric layer, wherein the second dielectric layer covers the top of each of the plurality of metal structures, a top opening of the air gap structure and the top of the first dielectric layer;

wherein the arranging the plurality of metal structures at intervals on the substrate comprises:

arranging a plurality of initial metal layers at intervals on the substrate;

oxidizing a part of a sidewall of each of the plurality of initial metal layers to form a protective layer; and forming, by each of the plurality of initial metal layers which is not oxidized, the metal layer.

2. The method for preparing a semiconductor structure of claim 1, wherein the forming the sacrificial sidewall with the preset thickness on the sidewall of each of the metal structures comprises:

forming an initial sacrificial layer with uniform thickness on a surface of each of the metal structures and a surface of the substrate; and removing the initial sacrificial layer arranged on the top of the metal structure each of the metal structures and the surface of the substrate, to retain the initial sacrificial layer on the sidewall of each of the metal structures to form the sacrificial sidewall.

3. The method for preparing a semiconductor structure of claim 1, wherein the oxidizing the part of the sidewall of each of the plurality of initial metal layers comprises:

employing a liquid ozone solution for processing.

4. The method for preparing a semiconductor structure of claim 1, wherein each of the plurality of metal structures further comprises a first barrier layer, wherein the first barrier layer covers a top of the metal layer and a top of the protective layer.

5. The method for preparing a semiconductor structure of claim 4, further comprising:

after the forming the sacrificial sidewall with the preset thickness on the sidewall of each of the plurality of metal structures, forming an initial first dielectric layer between adjacent sacrificial sidewalls and on each of the plurality of metal structures, and removing a part of the initial first dielectric layer by planarization process to form the first dielectric layer, wherein the top of the first dielectric layer is flush with a top of the first barrier layer.

6. The method for preparing a semiconductor structure of claim 1, wherein each of the plurality of metal structures further comprises a second barrier layer, and the second barrier layer is arranged between the substrate and the metal layer as well as the substrate and the protective layer.

7. The method for preparing a semiconductor structure of claim 1, wherein the plurality of metal structures comprise a plurality of first metal structures and a plurality of second metal structures, and a first spacing exists between adjacent first metal structures and a second spacing exists between adjacent second metal structures, and the first spacing being smaller than the second spacing, wherein forming a sacrificial sidewall with a preset thickness on the sidewall of each of the plurality of metal structures and forming an air gap structure on the sidewall of each of the plurality of metal structures comprise: forming a first sacrificial sidewall on a sidewall of each of the plurality of first metal structures, and removing the first sacrificial sidewall to form a first air gap structure; and forming a second sacrificial sidewall on a sidewall of each of the plurality of second metal structures, and removing the second sacrificial sidewall to form a second air gap structure.

8. The method for preparing a semiconductor structure of claim 7, wherein a thickness of the first sacrificial sidewall is identical to a thickness of the second sacrificial sidewall, and a width of the first air gap structure and a width of the second air gap structure in a direction parallel to the substrate are identical.

9. The method for preparing a semiconductor structure of claim 7, wherein a thickness of the first sacrificial sidewall is smaller than a thickness of the second sacrificial sidewall, a width of the first air gap structure in a direction parallel to the substrate is smaller than a width of the second air gap structure in the direction parallel to the substrate.

10. The method for preparing a semiconductor structure of claim 1, wherein the removing the sacrificial sidewall comprises:

employing a low-temperature phosphoric acid solution for processing, to remove the sacrificial sidewall, wherein a temperature of the low-temperature phosphoric acid solution is less than or equal to 120° C.

11. The method for preparing a semiconductor structure of claim 2, wherein the removing the sacrificial sidewall comprises:

employing a low-temperature phosphoric acid solution for processing, to remove the sacrificial sidewall, wherein a temperature of the low-temperature phosphoric acid solution is less than or equal to 120° C.

12. The method for preparing a semiconductor structure of claim 1, wherein the removing the sacrificial sidewall comprises:

employing a low-temperature phosphoric acid solution for processing, to remove the sacrificial sidewall, wherein a temperature of the low-temperature phosphoric acid solution is less than or equal to 120° C.

\* \* \* \* \*